United States Patent
Friebe et al.

(10) Patent No.: US 8,194,429 B2
(45) Date of Patent: Jun. 5, 2012

(54) INVERTER COMPRISING NORMALLY CONDUCTIVE GATE-CONTROLLED SEMICONDUCTOR SWITCHES

(75) Inventors: Jens Friebe, Nörten-Hardenberg (DE); Oliver Prior, Marsberg (DE); Frank Greizer, Kaufungen (DE); Matthias Victor, Niestetal (DE); Sven Bremicker, Alheim (DE)

(73) Assignee: SMA Solar Technology AG, Niestetal (DE)

( * ) Notice: Subject to any disclaimer, the term of this patent is extended or adjusted under 35 U.S.C. 154(b) by 290 days.

(21) Appl. No.: 12/643,142

(22) Filed: Dec. 21, 2009

(65) Prior Publication Data
US 2010/0157639 A1    Jun. 24, 2010

(30) Foreign Application Priority Data
Dec. 23, 2008    (EP) .................................. 08172700

(51) Int. Cl.
*H02M 7/5387*    (2007.01)
(52) U.S. Cl. .................... 363/132; 363/17; 363/56.02
(58) Field of Classification Search ............... 363/17, 363/24, 37, 56.01, 56.02, 56.03, 56.04, 131, 363/132
See application file for complete search history.

(56) References Cited

U.S. PATENT DOCUMENTS

| | | | | |
|---|---|---|---|---|
| 7,301,790 B2 * | 11/2007 | Li et al. | ............... | 363/132 |
| 7,859,861 B2 * | 12/2010 | Taurand et al. | ............... | 363/17 |
| 8,030,882 B2 * | 10/2011 | Ito et al. | ............... | 320/104 |
| 2011/0141785 A1 * | 6/2011 | Duan et al. | ............... | 363/131 |

\* cited by examiner

*Primary Examiner* — Adolf Berhane
*Assistant Examiner* — Lakaisha Jackson
(74) *Attorney, Agent, or Firm* — Thomas, Kayden, Horstemeyer & Risley, LLP

(57) ABSTRACT

An inverter has two input lines; an inverter bridge connected between the input lines and including at least one half-bridge having two normally conductive gate-controlled semiconductor switches; a controller which supplies control voltages to the gates of the semiconductor switches in an operative state of the inverter; and a DC voltage source for supplying an auxiliary control voltage to the gates of the semiconductor switches in an inoperative state of the inverter so as to hold the inverter bridge in a non-conductive state between the input lines. The DC voltage source has a charging unit connected between the input lines in series with a further normally conductive gate-controlled semiconductor switch, and charging a storage unit for electric charge, which is connected to the gate of the further semiconductor switch such that this switch becomes non-conductive, when the storage unit has been sufficiently charged for providing the auxiliary control voltage.

13 Claims, 1 Drawing Sheet

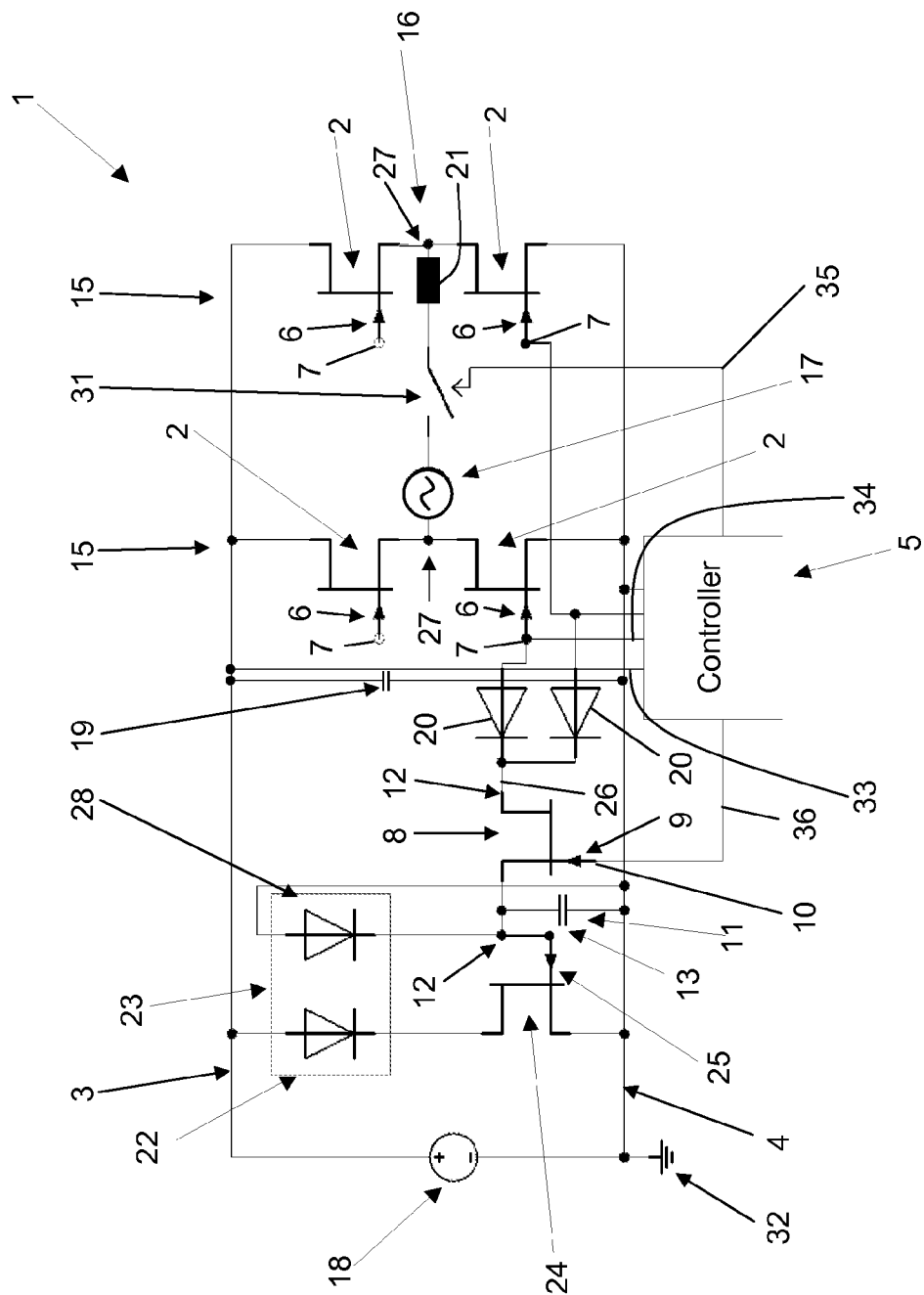

US 8,194,429 B2

INVERTER COMPRISING NORMALLY CONDUCTIVE GATE-CONTROLLED SEMICONDUCTOR SWITCHES

CROSS REFERENCE TO RELATED APPLICATIONS

This application claims priority to co-pending European Patent Application No. EP 08 172 700.0 entitled "Selbstleitende elektrische Schaltung", and filed Dec. 23, 2008.

FIELD OF THE INVENTION

The present invention generally relates to inverters comprising an inverter bridge for inverting a voltage of a fixed polarity, particularly a DC voltage, into an AC voltage. More particularly, the present invention relates to an inverter for feeding electric energy from a DC voltage source in an AC power grid. Even more particularly, the DC voltage source may be a photovoltaic generator.

BACKGROUND OF THE INVENTION

An inverter according to the present invention may also be used for other applications than feeding electric energy in an AC power grid. For example, it may provide an output AC voltage of varying frequency to control an electric AC motor, for example.

Further, the inverter according to the present invention may either output a single-phase AC voltage or a multi-phase AC voltage, particularly a three-phase AC voltage. When, in the following, a particular inverter is described as being a single-phase or a three-phase inverter, this description should always be read to also cover corresponding multi-phase or single-phase inverters.

Even further, a combination of the inverter according to the present invention with further electric or electronic units, like, for example, a boost-converter at its input side, is possible and may be useful. The present invention relates to the construction of the inverter as such.

German patent DE 10 2004 030 912 B3 discloses an inverter with a H-shaped inverter bridge between two input lines. The inverter bridge comprises gate-controlled semiconductor switches of metal oxide semiconductor field effect transistor (MOSFET) construction. These MOSFETs are normally non-conductive, i.e. without a control voltage applied to their gates they are not conductive between their source and their drain. Such semiconductor switches are also described as being of the "normally off type". Due to this property of its semiconductor switches the overall inverter bridge is non-conductive as long as no control voltage is present at the gates of the semiconductor switches. As a result, a short circuit between the input lines and between output ports of the inverter is automatically avoided in the case of no controller being active. This case of no controller being active occurs, for example, upon using the known inverter for feeding electric energy from a photovoltaic power generator into an AC power grid during the night, and particularly in the morning, when the photovoltaic power generator builds up an output voltage which is not yet high enough to power the controller of the inverter.

The quality of an inverter may be determined by its efficiency factor which strongly depends on the electrical properties of the gate-controlled semiconductor switches used. It is generally known that silicon carbide (SiC) semiconductor switches have particular advantages with regard to the efficiency factor. In addition to low ohmic and switching resistivities, SiC semiconductor switches also have the advantage of being able shut off particularly high voltages. Further, SiC semiconductor switches function properly even at high temperatures of up to 600° C. However, SiC semiconductor switches at reasonable cost are mainly available as JFETs (Junction Field Effect Transistors). In contrast to MOSFETs, JFETs are normally conductive between their source and their drain, if no control voltage is present at their gate, i. e. they are of the "normally on type". Normally conductive semiconductor switches, however, have restrictions as their use may result in short circuits, if no control voltage is present. This particularly applies to their use in inverters.

To compensate for a JFET normally being conductive, it is known to combine it in a so-called cascode circuitry with a MOSFET which is connected between the gate and the source of the JFET and which is controlled by a control voltage to thus indirectly control the JFET. A cascode, however, has a reduced efficiency and comprises one additional MOSFET per JFET.

US-patent application publication 2008/0174184 A1 discloses a device for controlling a JFET power electronic switch of the normally on type. The control device comprises a main gate-control circuit powered by a main power source for driving the gate of the JFET switch. The control device further comprises an auxiliary power source whose positive terminal is connected to the source of the JFET switch and whose negative terminal is connected to the gate of the JFET switch. The control device comprises a protection switching device that is switchable between two states, an auxiliary circuit for controlling the switching device, and an auxiliary power source whose positive terminal is connected to the source of the JFET switch and whose negative terminal is connected to the gate of the JFET switch, bypassing said gate-control circuit in one of the two positions of the switching device. The switching device is an electromagnetic or electric switch. The auxiliary power source may be a capacitor charged via a diode by a voltage powering the control device.

International patent application publication WO02/50897 A2 discloses an electronic power circuit comprising at least one power semiconductor whose control inputs are connected to a trigger device and comprising a power supply which, on the output side, is connected to terminals of the trigger device and, on the input side, is connected to a device to which a supply voltage is applied. A self-conducting power semiconductor is provided as the power semiconductor to economically reduce the forward power losses and switching losses of the electronic power circuit. In one embodiment the electronic power circuit is an inverter comprising input lines. Between these input lines a capacitor is connected in series with a diode. The voltage over this capacitor is used to power the power supply. The diode ensures that a charge loaded onto the capacitor is kept there in case of a break down of an input voltage applied between the input lines.

There still is a need for an inverter constructed of normally conductive semiconductor switches in which nevertheless a short circuit between the input lines is avoided even with just a low voltage being applied between the input lines.

SUMMARY OF THE INVENTION

In one aspect, the present invention relates to an inverter which comprises: two input lines to which a voltage of a fixed polarity is supplied in operation of the inverter; an inverter bridge connected between the input lines and including at least one half-bridge, each half-bridge comprising two normally conductive gate-controlled semiconductor switches, such that the complete inverter bridge is conductive between the input lines, if no control voltage is applied to the gates of the semiconductor switches; a controller which supplies control voltages to the gates of the gate-controlled semiconductor switches of the inverter bridge in an operative state of the inverter; and a DC voltage source for supplying an auxiliary control voltage to the gates of at least some of the semiconductor switches of the inverter bridge in an inoperative state of the inverter so as to hold the inverter bridge in a non-conductive state between the input lines, the DC voltage source comprising a storage unit for electric charge, and a charging unit comprising an input side and an output side. In this inverter, a DC current flowing through the input side of the charging unit causes a DC current through the output side of the charging unit; the charging unit, at its input side, is connected between the input lines in series with a further normally conductive gate-controlled semiconductor switch which is conductive, if no control voltage is applied to its gate; and the charging unit, at its output side, is connected to the storage unit, and the storage unit is connected to the gate of the further normally conductive gate-controlled semiconductor switch such that the further normally conductive gate-controlled semiconductor switch becomes non-conductive, when the storage unit has been sufficiently charged for providing the auxiliary control voltage.

In another aspect, the present invention relates to an inverter which comprises: two input lines to which a voltage of a fixed polarity is supplied in operation of the inverter; an inverter bridge connected between the input lines and including at least one half-bridge, each half-bridge comprising two normally conductive gate-controlled semiconductor switches, such that the complete inverter bridge is conductive between the input lines, if no control voltage is applied to the gates of the semiconductor switches; a controller which supplies control voltages to the gates of the gate-controlled semiconductor switches of the inverter bridge in an operative state of the inverter; and a DC voltage source for supplying an auxiliary control voltage to the gates of at least some of the semiconductor switches of the inverter bridge in an inoperative state of the inverter so as to hold the inverter bridge in a non-conductive state between the input lines, the DC voltage source comprising at least one storage unit for electric charge, and a charging unit comprising an input side and an output side. In this inverter, a DC current flowing through the input side of the charging unit causes a DC current through the output side of the charging unit; the charging unit, at its input side, is connected between the input lines in series with a further normally conductive gate-controlled semiconductor switch which is conductive, if no control voltage is applied to its gate; the charging unit, at its output side, is connected to the at least one storage unit, and the storage unit is connected to the gate of the further normally conductive gate-controlled semiconductor switch such that the further normally conductive gate-controlled semiconductor switch becomes non-conductive, when the storage unit has been sufficiently charged for providing the auxiliary control voltage; the at least one storage unit provides the auxiliary control voltage for a plurality of the at least some of the normally conductive gate-controlled semiconductor switches of the inverter bridge; and at least one further normally conductive gate-controlled semiconductor switch is connected between the storage unit and the gates of the at least some of the normally conductive gate-controlled semiconductor switches of the inverter bridge, the controller applying a control voltage to the gate of the at least one further normally conductive gate-controlled semiconductor switch in the operative state of the inverter.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention can be better understood with reference to the following drawing. The components in the drawing are not necessarily to scale, emphasis instead being placed upon clearly illustrating the principles of the present invention.

FIG. 1 is a circuit diagram showing the principles of one embodiment of the inverter.

DETAILED DESCRIPTION

In the inverter, the normally conductive semiconductor switches are not connected in series with a normally non-conductive semiconductor switch to build up a cascode. Instead, the controller of the inverter directly controls the normally conductive semiconductor switches in that it applies control voltages directly to the gates of these semiconductor switches. To nevertheless avoid a short circuit between the input lines, if the controller breaks down, an auxiliary voltage source is provided which then applies an auxiliary control voltage to the gates of at least some of the normally conductive semiconductor switches to turn them off. The auxiliary voltage source can be kept quite simple as only little charges are necessary for applying the auxiliary control voltage to the normally conductive semiconductor switches. Thus, the drawback of normally conductive semiconductor switches may be compensated for with a simple additional DC voltage source, i.e. at little cost. Further, there is no need for a separate auxiliary voltage source for each normally conductive semiconductor switch. Instead, one such additional auxiliary voltage source may apply the auxiliary control voltage to a plurality of semiconductor switches in case of a breakdown of the controller.

The additional auxiliary voltage source of the inverter does not require any part connected in series with the semiconductor switches of the inverter bridge between the input lines to compensate for some specific effects of normally conductive semiconductor switches. Such an additional part connected in series with the semiconductor switches would reduce the efficiency factor of the inverter.

There is also no need to have a part of the inverter which is connected between its two input lines and through which an electric current continuously flows in operation of the inverter. Such continuous currents would also mean continuous losses and thus a reduction of the efficiency factor of the inverter.

The auxiliary voltage source of the inverter comprises a storage unit for electric charge, for example an accumulator or capacitor, which is loaded by a charging unit. Charging the accumulator or capacitor costs electric power but for a limited time only. Further, with an appropriate size of the accumulator or capacitor the total electric energy spent for charging the storage unit for electric charge may be kept small.

Particularly, the auxiliary voltage source has a charging unit which is connected between the input lines in series with a further normally conductive gate-controlled semiconductor switch. This charging unit charging the storage unit for electric charge may, for example, comprise a photovoltaic MOSFET driver which is commercially available from Panasonic under the trademark "Solardrive". The charging unit charges the storage unit for electric charge at its output side, when a current flows through its input side. As the voltage over the storage unit for electric charge which serves as the auxiliary control voltage is also applied to the gate of the further normally conductive semiconductor switch, the current through the input side of the charging unit is shut off, as soon as the storage unit for electric charge has been sufficiently charged for providing the auxiliary control voltage. This means that only a small total amount of current flows through the charging unit. This small amount of current, on the other hand, may already flow through the charging unit when only a small voltage is supplied to the input lines of the inverter, like it is the case in the morning with a photovoltaic power generator connected to the input lines. Additionally, the charging unit is protected against higher voltages which may be applied to the input lines of the inverter later by means of the semiconductor switch connected in series with the input side of the charging unit which, as a normally conductive semiconductor switch, like for example a JFET, easily shuts off high voltages.

An even further normally conductive gate-controlled semiconductor switch may be connected between the auxiliary voltage source and the gates of the normally conductive semiconductor switches of the inverter bridge of the inverter. As long as the controller of the inverter is active, it may apply a control voltage to this even further normally conductive semiconductor switch to shut off the auxiliary control voltage from the gates of the semiconductor switches of the inverter bridge. If the controller breaks down or as long as the controller is not yet active, there is no control voltage applied to the gate of this even further normally conductive semiconductor switch. Thus, this normally conductive semiconductor switch is conductive and conducts the auxiliary control voltage to the gate of the connected semiconductor switches of the inverter bridge. In this way, there is no need for the controller to override the auxiliary control voltage in controlling the semiconductor switches of the inverter bridge. In the same way as only one auxiliary voltage source is required in the inverter to provide the auxiliary control voltage to a plurality of semiconductor switches in the inverter bridge, one even further normally conductive semiconductor switch is sufficient to shut off the auxiliary control voltage from the plurality of semiconductor switches as long as this auxiliary control voltage is not needed. However, if an electric line for providing the auxiliary control voltage to the gate of several semiconductor switches branches between the even further normally conductive semiconductor switches and the single semiconductor switches, diodes are provided in each of these branches to avoid a mixing-up of the control voltages applied by the controller to the gates of the single semiconductor switches via these branches of the electric line.

Generally, the voltage applied to the input lines of the inverter is a DC voltage. In the inverter, the auxiliary control voltage needs not to be applied to the gate of every semiconductor switch of the inverter bridge. A short circuit between the input lines of the inverter is already provided, if the auxiliary control voltage is supplied to some of the semiconductor switches of the inverter bridge which are selected in a suitable way. One such suitable selection includes one normally conductive semiconductor switch per inverter half bridge, wherein all these selected semiconductor switches are connected to the same input line of the inverter.

To the end of also avoiding a short circuit between the output ports of the inverter, it may additionally be necessary to apply the auxiliary control voltage to further semiconductor switches of the inverter bridge or to provide an additional security switch. Avoiding a short circuit between the output ports of the inverter may be necessary with a public power grid being connected to these output ports, for example.

In cases where an AC voltage will continuously be present at the output ports in the operation of the inverter, like in such cases in which it is connected to a public power grid, this AC voltage may auxiliary be used to charge the storage for electric charge of the inverter which is normally charged by the charging unit, or to charge a further storage for electric charge as a backup means.

The normally conductive semiconductor switches of the inverter may comprise SiC semiconductor material. The semiconductor switches may be field effect transistors. Particularly, they may be JFETS.

The inverter may comprise a buffer capacity connected between the input lines to smoothen the voltage between the input lines despite varying currents being drawn from the input lines via the inverter bridge.

Additionally, the inverter bridge of the inverter may comprise at least one inductivity connected between the center points of the half bridges of the inverter bridge. Such inductors are, for example, known from U.S. Pat. No. 7,411,802 B2 which is herein incorporated by reference.

The inverter is particularly suited for feeding electric power provided by a DC voltage source in an AC power grid. The DC voltage source may be a battery or accumulator, a fuel cell, a fuel cell stack or the like. One particular DC voltage source, however, is a photovoltaic power generator. The inverter has the particular effect that the charging unit may charge the storage unit for electric charge, even if a short circuit current flows through the inverter bridge, as the charging unit already charges the storage unit for electric charge at a very small voltage applied to its input side. As soon as the storage unit for electric charge is sufficiently charged by the charging unit, the auxiliary voltage is applied to the semiconductor switches of the inverter bridge stopping the short circuit current through the inverter bridge and thus allowing to build up a voltage between the input lines which is sufficient to power the controller of the inverter, for example.

The inverter may be implemented in various surroundings and topologies which are known to those skilled in the art. These topologies include, but are not limited to those which are known as H4, H5, Heric, 3-level, 5-level and Gonzales.

Referring now in greater detail to the drawings, FIG. 1 illustrates the electric circuitry of an inverter 1 which inverts a DC voltage between two input lines 3 and 4 supplied by an external DC voltage source 18, which may be a photovoltaic power generator, for example, in an AC voltage to feed electric energy from the DC voltage source 18 in an AC power grid 17. The inverter 1 comprises an inverter bridge 16 comprising two inverter half bridges 15 here, as the power grid 17 is shown to be a single-phase AC power grid. Each inverter half bridge 15 comprises two normally conductive gate-controlled semiconductor switches 2, one semiconductor switch 2 being connected to input line 3 and one semiconductor switch being connected to input line 4. Center points 27 of both inverter half bridges 15 are connected to the AC power grid 17, an inductor 21 and a mains switch 31 being connected in series between one of the center points 27 and the power grid 17. A buffer capacity 19 is provided between the input lines 3 and 4 at the input side of the inverter bridge 16. Input line 4 is connected to earth 32 here. The semiconductor switches 2 of the inverter bridge 16 are controlled by a controller 5 which applies individual control voltages 7 to the gates 6 of all the semiconductor switches 2. FIG. 1 shows signal lines 33 and 34 between the controller 5 and the gates 6 of those semiconductor switches 2 which are connected to the input line 4 but such control lines also exist between the controller 5 and the gates 6 of the semiconductor switches 2 connected to the input line 3. Further, there is a signal line 35 from the controller 5 to the mains switch 31 which may be constructed as a relay. An even further control line 36 extends from the controller 5 to the gate 9 of a normally conductive gate-controlled semiconductor switch 8. The controller 5 is powered by the voltage between the input lines 3 and 4. In normal operation of the inverter 1 it closes the main switch 31 and controls the semiconductor switches 2, the semiconductor switches 2 being switched at a frequency which is at least as high as the frequency of the AC power grid 17 but which may be much higher to shape the current flowing through the inverter bridge 16. If the controller 5 is not yet powered by a sufficient voltage between the input lines 3 or 4, or if the controller 5 breaks down, the controller 5 does not yet or no longer provide control voltages 7 to the gates 6 of the semiconductor switches 2. To nevertheless avoid a short circuit between the input lines 3 and 4 via the inverter bridge 16, an auxiliary DC voltage source 11 provides an auxiliary control signal 12 to at least some of the normally conductive semiconductor switches 2. According to FIG. 1, these at least some semiconductor switches 2 are those connected to the input line 4. The auxiliary DC voltage source 11 comprises a capacitor 13 as a storage unit for electric charge which is charged via a charging unit 23. Here, the charging unit 23 is a photovoltaic MOSFET driver, like, for example, a Solardrive™ by Panasonic, whose input side 22 is connected between the input lines 3 and 4 in series with a normally conductive semiconductor switch 24. A current flowing through the input side 22 of the charging unit 23 causes a current through the output side 28 of the charging unit 23 which charges one side of the capacitor 13. At its other side the capacitor 13 is connected to the input line 4. The voltage over the capacitor 11 is the auxiliary control voltage 12, and is also applied to the gate 25 of the semiconductor switch 24. Thus, the auxiliary control voltage 12 turns off the semiconductor switch 24 when the capacitor 13 is sufficiently loaded, and thus stops the current through the input side 22 of the charging unit 23. In this way, there is no continuous loss of electric power due to the charging unit 23. The auxiliary control voltage 12 is supplied to the semiconductor switches 2 connected to the input line 4 via the normally conductive semiconductor switch 8. Despite the fact that the auxiliary control voltage is supplied to two semiconductor switches 2, as shown, the auxiliary voltage source 11 only has one storage unit for electric charge 11 and one semiconductor switch 8. A line 26 forwarding the auxiliary control voltage 12 branches towards the gates 6 of the semiconductor switches 2. Diodes 20 are provided in the branches of the line 26 to avoid a mixing-up of the individual control voltages 7 applied to the gates 6 via the signal lines 33 and 34 by the controller 5. The normally conductive semiconductor switch 8 conducts the auxiliary control voltage 12 towards the gates 6 of the semiconductor switches 2 unless the controller 5 applies a control voltage 10 to its gate 9 which switches the semiconductor switch 8 in an off-state. This control voltage 10 is only applied when the controller 5 is working. i.e. when the auxiliary control voltage 12 is not needed.

In case of the external DC voltage source 18 being a photovoltaic power generator, the voltage between the input lines 3 and 4 in the morning slowly increases due to the increasing output voltage of the photovoltaic power generator 18. However, this output voltage is shorted by the inverter bridge 16 due to the normally conductive switches 2. Nevertheless, a small current also flows through the normally conductive switch 24 and the input side 22 of the charging unit 23. This small current through the input side 22 is sufficient to cause a current through the output side 28 of the charging unit 23 which charges the capacitor 13 until it provides the auxiliary DC voltage 12. As soon as the auxiliary DC voltage 12 is present over the capacitor 11, it is also present at the gate 25 of the semiconductor switch 24 and switches this semiconductor switch 24 in an off-state stopping the current through the input side 22 of the charging unit 23. Further, the auxiliary control voltage 12 is applied via the semiconductor switch 8 and the diodes 20 to the gates 6 of the semiconductor switches 2 connected to the input line 4. Thus, the switches are also switched in an off-state. As a result, the output voltage of the photovoltaic power generator 18 is no longer shorted via the inverter bridge 16 and may now build up to a level sufficient for powering the controller 5. As soon as the controller 5 is powered, it starts controlling the switches 2 of the inverter bridge 16. Further, it switches the switch 8 in an off-state by applying the control voltage 10 to its gate 9, and closes the main switch 31 to connect the inverter bridge 16 to the AC power grid 17.

If the controller 5 fails and no longer supplies the control voltages 7 and 10, the auxiliary control voltage 12 is applied to the gate 6 of the semiconductor switches 2 again and avoids a short circuit between the input lines 3 and 4 via the inverter bridge 16. If the auxiliary control voltage 12 is supplied to all switches 2 of the inverter bridge 16, even a short circuit between the center points 27 of the half bridges 15 is avoided via which the AC power grid 17 may otherwise be shorted, if the main switch 31 is not switched in an off-state.

Many variations and modifications may be made to the embodiments of the invention without departing substantially from the spirit and principles of the invention. All such modifications and variations are intended to be included herein within the scope of the present invention, as defined by the following claims.

We claim:

1. An inverter comprising:
   two input lines to which a voltage of a fixed polarity is supplied in operation of the inverter;
   an inverter bridge connected between the input lines and including at least one half-bridge, each half-bridge comprising two normally conductive gate-controlled semiconductor switches, such that the complete inverter bridge is conductive between the input lines, if no control voltage is applied to the gates of the semiconductor switches;
   a controller which supplies control voltages to the gates of the gate-controlled semiconductor switches of the inverter bridge in an operative state of the inverter; and
   a DC voltage source for supplying an auxiliary control voltage to the gates of at least some of the semiconductor switches of the inverter bridge in an inoperative state of the inverter so as to hold the inverter bridge in a non-conductive state between the input lines, the DC voltage source comprising a storage unit for electric charge, and a charging unit comprising an input side and an output side, wherein
      a DC current flowing through the input side of the charging unit causes a DC current through the output side of the charging unit,
      the charging unit, at its input side, is connected between the input lines in series with a further normally conductive gate-controlled semiconductor switch which is conductive, if no control voltage is applied to its gate, and
      the charging unit, at its output side, is connected to the storage unit, and the storage unit is connected to the gate of the further normally conductive gate-controlled semiconductor switch such that the further normally conductive gate-controlled semiconductor switch becomes non-conductive, when the storage unit has been sufficiently charged for providing the auxiliary control voltage.

2. The inverter of claim 1, wherein no element of the DC voltage source is connected between the input lines in series with the normally conductive gate-controlled semiconductor switches of the inverter bridge.

3. The inverter of claim 1, wherein no element of the DC voltage source through which a continuous current flows in operation of the inverter is connected between the input lines in parallel to the inverter bridge.

4. The inverter of claim 1, wherein the storage unit is selected from a group of storages consisting of capacitors and accumulators.

5. The inverter of claim 1, wherein one storage unit provides the auxiliary control voltage for a plurality of the at least some of the normally conductive gate-controlled semiconductor switches of the inverter bridge.

6. The inverter of claim 1, wherein one storage unit provides the auxiliary control voltage for all of the at least some of the normally conductive gate-controlled semiconductor switches of the inverter bridge.

7. The inverter of claim 1, wherein one storage unit provides the auxiliary control voltage for all of the normally conductive gate-controlled semiconductor switches of the inverter bridge.

8. The inverter of claim 1, wherein at least one additional normally conductive gate-controlled semiconductor switch which is connected between the storage unit for electric charge and the gates of the normally conductive gate-controlled semiconductor switches of the inverter bridge, the controller applying a control voltage to the gate of the at least one additional normally conductive gate-controlled semiconductor switch in the operative state of the inverter.

9. The inverter of claim 1, wherein at least one normally conductive gate-controlled semiconductor switch per inverter half bridge is supplied with the auxiliary control voltage.

10. The inverter of claim 1, wherein the two input lines are connected to an external DC power source supplying the voltage of fixed polarity, and wherein the inverter bridge feeds electric power towards an AC power grid.

11. The inverter of claim 10, wherein the external DC power source comprises a photovoltaic generator.

12. An inverter comprising:
two input lines to which a voltage of a fixed polarity is supplied in operation of the inverter;
an inverter bridge connected between the input lines and including at least one half-bridge, each half-bridge comprising two normally conductive gate-controlled semiconductor switches, such that the complete inverter bridge is conductive between the input lines, if no control voltage is applied to the gates of the semiconductor switches;
a controller which supplies control voltages to the gates of the gate-controlled semiconductor switches of the inverter bridge in an operative state of the inverter; and
a DC voltage source for supplying an auxiliary control voltage to the gates of at least some of the semiconductor switches of the inverter bridge in an inoperative state of the inverter so as to hold the inverter bridge in a non-conductive state between the input lines, the DC voltage source comprising at least one storage unit for electric charge, and a charging unit comprising an input side and an output side, wherein
a DC current flowing through the input side of the charging unit causes a DC current through the output side of the charging unit,
the charging unit, at its input side, is connected between the input lines in series with a further normally conductive gate-controlled semiconductor switch which is conductive, if no control voltage is applied to its gate,
the charging unit, at its output side, is connected to the at least one storage unit, and the storage unit is connected to the gate of the further normally conductive gate-controlled semiconductor switch such that the further normally conductive gate-controlled semiconductor switch becomes non-conductive, when the storage unit has been sufficiently charged for providing the auxiliary control voltage,
the at least one storage unit provides the auxiliary control voltage for a plurality of the at least some of the normally conductive gate-controlled semiconductor switches of the inverter bridge, and
at least one additional normally conductive gate-controlled semiconductor switch is connected between the storage unit and the gates of the at least some of the normally conductive gate-controlled semiconductor switches of the inverter bridge, the controller applying a control voltage to the gate of the at least one additional normally conductive gate-controlled semiconductor switch in the operative state of the inverter.

13. The inverter of claim 12, wherein the two input lines are connected to a photovoltaic generator supplying the voltage of fixed polarity, and wherein the inverter bridge feeds electric power in an AC power grid.

* * * * *